US009024305B2

(12) United States Patent
Choi et al.

(10) Patent No.: US 9,024,305 B2
(45) Date of Patent: May 5, 2015

(54) ORGANIC LIGHT EMITTING DIODE DISPLAY AND METHOD FOR MANUFACTURING THE SAME

(71) Applicant: Samsung Display Co., Ltd., Yongin-si, Gyeonggi-do (KR)

(72) Inventors: Jae-Beom Choi, Suwon-si (KR); Hwa-Jin Noh, Hwaseong-si (KR); Hyoung-Min Park, Gwangju (KR); Yong-Woo Park, Suwon-si (KR)

(73) Assignee: Samsung Display Co., Ltd. (KR)

( * ) Notice: Subject to any disclaimer, the term of this patent is extended or adjusted under 35 U.S.C. 154(b) by 13 days.

(21) Appl. No.: 14/023,666

(22) Filed: Sep. 11, 2013

(65) Prior Publication Data

US 2014/0346449 A1 Nov. 27, 2014

(30) Foreign Application Priority Data

May 21, 2013 (KR) ........................ 10-2013-0057423

(51) Int. Cl.

*H01L 27/32* (2006.01)
*H01L 51/56* (2006.01)
*H01L 51/52* (2006.01)

(52) U.S. Cl.

CPC ........ *H01L 27/3211* (2013.01); *H01L 27/3244* (2013.01); *H01L 51/56* (2013.01); *H01L 51/5275* (2013.01); *H01L 27/3258* (2013.01)

(58) Field of Classification Search

CPC ........................... H01S 5/06258; H01S 5/1228

USPC ........................................................... 257/40

See application file for complete search history.

(56) References Cited

U.S. PATENT DOCUMENTS

| | | | | |
|---|---|---|---|---|
| 5,659,562 | A * | 8/1997 | Hisa | 372/96 |
| 7,724,796 | B2 * | 5/2010 | Forrest et al. | 372/46.01 |
| 2006/0091399 | A1 * | 5/2006 | Lee | 257/72 |
| 2008/0192791 | A1 * | 8/2008 | Furukawa et al. | 372/50.12 |
| 2009/0206733 | A1 | 8/2009 | Hwang et al. | |
| 2011/0207039 | A1 * | 8/2011 | Yamada et al. | 430/56 |
| 2011/0297949 | A1 * | 12/2011 | Lee et al. | 257/66 |
| 2013/0001600 | A1 | 1/2013 | Lim et al. | |

FOREIGN PATENT DOCUMENTS

| | | | |
|---|---|---|---|
| EP | 2541638 | A2 | 1/2013 |
| KR | 1020050104158 | A | 11/2005 |
| KR | 1020090089151 | A | 8/2009 |
| KR | 1020120001998 | A | 1/2012 |
| KR | 1020130007165 | A | 1/2013 |

* cited by examiner

*Primary Examiner* — Thao X Le
*Assistant Examiner* — Patricia Reddington
(74) *Attorney, Agent, or Firm* — Cantor Colburn LLP

(57) ABSTRACT

An organic light emitting diode display includes a substrate, a planarization layer disposed on the substrate, a first electrode disposed on the planarization layer, an emission layer disposed on the first electrode, and a second electrode disposed on the emission layer, wherein an uneven pattern is formed on a top surface of the planarization layer, the uneven pattern comprises a strip line having a plurality of thicknesses and widths, and a thickness of the strip line becomes smaller as a distance from a center portion of the first electrode becomes larger.

10 Claims, 3 Drawing Sheets

S

A B

ORGANIC LIGHT EMITTING DIODE DISPLAY AND METHOD FOR MANUFACTURING THE SAME

This application claims priority to Korean Patent Application No. 10-2013-0057423, filed on May 21, 2013, and all the benefits accruing therefrom under 35 U.S.C. §119, the disclosure of which is incorporated herein in its entirety by reference.

BACKGROUND (1) Field

The invention relates to an organic light emitting diode display and a method for manufacturing the same, and more particularly, to an organic light emitting diode display and a method for manufacturing the same with improved viewing angle.

(2) Description of the Related Art

An organic light emitting diode ("OLED") display generally includes two electrodes and an emission layer between the two electrodes, and an electron injected from one electrode and a hole injected from the other electrode combine with each other in the emission layer to form an exciton, and light is emitted by energy generated from the exciton.

Since the OLED display is a self-emission type display device and does not require a separate light source, it has an advantage of low power consumption, and also may reduce volume and weight of a display device including the OLED display.

Meanwhile, the OLED display includes a plurality of pixels such as red pixel, blue pixel, green pixel, for example, and may display full colors by aggregating the pixels.

SUMMARY

According to an exemplary embodiment of the disclosure, an uneven pattern is formed in a non-uniform manner for improved viewing angle and high color reproducibility of a display device.

In detail, an exemplary embodiment of the disclosure provides improvement in viewing angle and process simplification by forming an uneven pattern non-uniformly on a top surface of a planarization layer on a substrate of the display device.

Therefore, the disclosure provides a simplified process for forming an uneven pattern and achieving high color reproducibility at front and side views of the display device.

An exemplary embodiment of the disclosure provides an organic light emitting diode ("OLED") display, including a substrate, a planarization layer on the substrate and comprising an uneven pattern on a top surface thereof, a first electrode on the planarization layer, an emission layer on the first electrode and a second electrode on the emission layer where the uneven pattern includes a plurality of strip lines respectively having a plurality of thicknesses and widths, and a thickness of a strip line of the plurality of strip lines becomes smaller as a distance from a center portion of the first electrode becomes larger.

A thin film transistor ("TFT") layer may be included between the substrate and the planarization layer according to an exemplary embodiment of the invention.

A width of strip lines of the plurality of strip lines may become larger as a distance from a center portion of the first electrode becomes larger according to an exemplary embodiment of the invention.

The planarization layer may have a thickness of about 0.1 micrometer (μm) to about 10 μm according to an exemplary embodiment of the invention.

The emission layer may include a plurality of sub-emission layers which emits lights of mutually different wavelengths, and the lights of different wavelengths combine for white-light emission according to an exemplary embodiment of the invention.

A color filter may be disposed under the first electrode according to an exemplary embodiment of the invention.

Another exemplary embodiment of the invention provides a manufacturing method of an OLED display including disposing a planarization layer on the substrate, forming an uneven pattern on a top surface of the planarization layer, disposing a first electrode on the planarization layer, disposing an emission layer on the first electrode, and disposing a second electrode on the emission layer, where the forming of the uneven pattern includes etching, and a difference in a degree of etching exists between a center portion and an end portion of the first electrode.

The manufacturing method may further include disposing a plurality of thin film transistors between the substrate and the planarization layer according to an exemplary embodiment of the invention.

In an exemplary embodiment, the forming of the uneven pattern on a top surface of the planarization layer may include arranging a mask including an opening defined therein on the planarization layer to expose the planarization layer to light, developing the planarization layer, etching the light exposed planarization layer, and curing the developed planarization layer according to an exemplary embodiment of the invention.

A difference in light transmission of the mask may exist between the center portion and the end portion according to an exemplary embodiment of the invention.

In an OLED display according to an exemplary embodiment of the invention, an uneven pattern is non-uniformly formed on a top surface of a planarization layer, and thus light may be scattered, thereby effectively preventing color shift due to a viewing angle.

Further, cost reduction may be achieved by simplification of a process for forming the uneven pattern.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
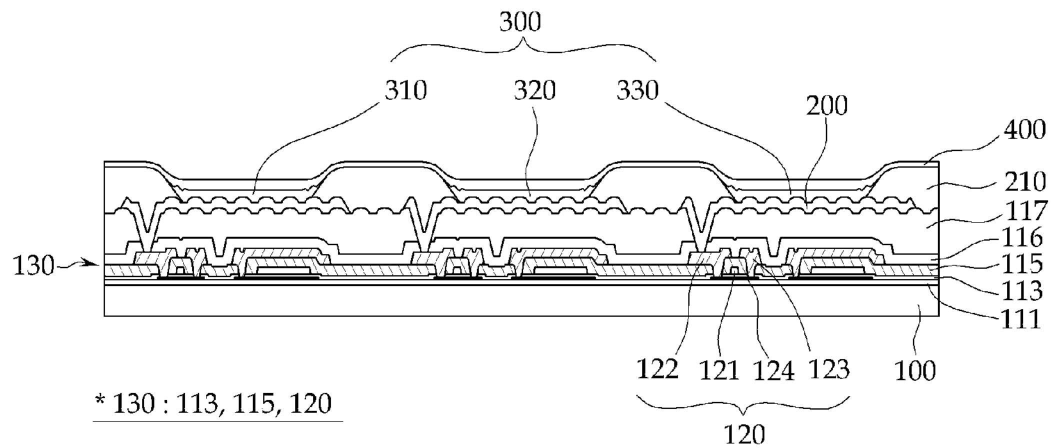
FIG. 1 is a schematic cross-sectional view of an organic light emitting diode display according to an exemplary embodiment of the invention, and illustrates a planarization layer 117 and a first electrode 200 having an uneven pattern.

Emission efficiency of an organic light emitting diode ("OLED") display varies depending on emitting materials. In this case, a material having low emission efficiency among red, green and blue may not display a color of a desired color coordinate. When white light is emitted by mixing red, green and blue, a desired white color may not be displayed due to a color having low emission efficiency. Therefore, since an expressible range of colors is limited, a lack of color reproducibility is not avoidable.

Light emitted from an emission layer goes out through an electrode and a substrate, and the light going outside is merely about 20 percent (%) of the light emitted from the emission layer due to total reflection occurring at an interface between the substrate and the electrode or on a surface of the substrate. As described above, luminance decreases when emission efficiency is low.

As such, the color reproducibility and luminance of the OLED display may decrease due to limits of the emitting materials and emission efficiency.

Accordingly, an uneven pattern is introduced as a supplementary method.

However, a conventional OLED display forming an uneven pattern places burdens of additional processes since additional work such as masking of photosensitive resin, development, high-temperature heat treatment, for example, are essential at the time of forming the uneven pattern. Further, there are problems of deformation of a substrate resulting from the high-temperature heat treatment, etc. Also, when unevennesses for forming the uneven pattern are formed on any one layer, a distance between the respective unevennesses is restricted due to limits of process, and this causes a problem that the distance between the unevennesses may not be less than a predetermined distance.

Hereinafter, the invention will be described in detail with reference to the exemplary embodiments shown in the accompanying drawings. However, the scope of the invention is not limited to the following description or the exemplary embodiments shown in the drawings. The accompanying drawings are only for illustration of exemplary embodiments selected from among the various exemplary embodiments of the invention, and thus, should not limit the scope of the invention.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

In the drawings, certain elements or shapes may be simplified or exaggerated to better illustrate the invention, and other elements present in an actual product may also be omitted. Thus, the drawings are intended to facilitate the understanding of the invention.

Throughout the invention, like reference numerals refer to like elements throughout the various figures and exemplary embodiments of the invention. In addition, when a layer or element is referred to as being "on" another layer or element, the layer or element may be directly on the other layer or element, or one or more intervening layers or elements may be interposed therebetween.

As illustrated in FIG. 1, an organic light emitting diode ("OLED") display according to an exemplary embodiment of the invention includes a substrate 100, a planarization layer 117 on the substrate 100, a first electrode 200 on the planarization layer 117, an emission layer 300 on the first electrode 200, and a second electrode 400 on the emission layer 300.

FIG. 1 illustrates an exemplary embodiment of an OLED display in which the planarization layer 117 and the first electrode 200 have an uneven pattern.

Hereinafter, exemplary embodiments of the invention will be explained based on a top emission OLED display as illustrated in FIG. 1.

The substrate 100 may include glass or polymer plastic that is used in OLED display devices. The substrate 100 may be transparent or non-transparent. The substrate 100 may be appropriately selected by a person skilled in the art.

A first electrode 200 is disposed on the substrate 100.

A thin film transistor layer 130 having a plurality of thin film transistor 120 may be disposed on the substrate 100. A buffer layer 111 formed, for example, of silicon oxide, silicon nitride, or the like may be further provided between the substrate 100 and the thin film transistor layer 130.

As illustrated in FIG. 1, a plurality of thin film transistors 120 may be disposed under the first electrode 200 is formed on the substrate 100. In an exemplary embodiment, a plurality of thin film transistors 120 may be formed before the first electrode 200 is formed on the substrate 100. The thin film transistor 120 includes a gate electrode 121, a drain electrode 122, a source electrode 123, and a semiconductor layer 124, which are formed on the substrate 100. The thin film transistor 120 also includes a gate insulating layer 113 and an interlayer insulating layer 115. The thin film transistor 120 is not limited to the structure shown in FIG. 1 and may also have other structures. Further, the thin film transistor 120 has a variety of types such as an organic thin film transistor of which the semiconductor layer 124 includes an organic material, a silicon thin film transistor of which the semiconductor layer 124 includes silicon, for example.

A first electrode 200, an emission layer 300, and a second electrode 400 are sequentially formed above the thin film transistor 120. In FIG. 1, the first electrode 200 serves as an anode as a pixel electrode which is electrically connected to the thin film transistor 120, and the second electrode 400 serves as a cathode.

The first electrode 200 is electrically connected to the thin film transistor 120 disposed below the first electrode 200. In this case, a planarization layer 117 is provided to cover the thin film transistor 120, the first electrode 200 is disposed on the planarization layer 117, and the first electrode 200 is electrically connected to the thin film transistor 120 through a contact hole provided in the planarization layer 117.

According to an exemplary embodiment of the invention, an insulating layer 116 may be formed between the thin film transistor layer 130 and the planarization layer 117. A plurality of contact holes (not shown) may be defined in the insulating layer to reveal or expose a part of the thin film transistor 120.

The planarization layer 117 may include a photosensitive organic material such as an acrylic material, for example, and may remove a step defined by underlying layers, to planarize a surface.

An uneven pattern is formed on a top surface of the planarization layer 117. The uneven pattern may effectively prevent color shift due to a viewing angle by scattering light concurrently with changing a micro resonance condition.

According to an exemplary embodiment of the invention, an OLED display is provided, where an uneven pattern is formed on a top surface of the planarization layer 117, the uneven pattern includes a plurality of strip lines respectively having a plurality of thicknesses $h_n$ and widths $d_n$, where n is a natural number, and a thickness of a strip line of the plurality of strip lines becomes smaller as a distance from a center portion of a first electrode becomes larger. Further, a width of the uneven pattern may become larger as a distance from a center portion of the first electrode becomes larger.

Figure 2:
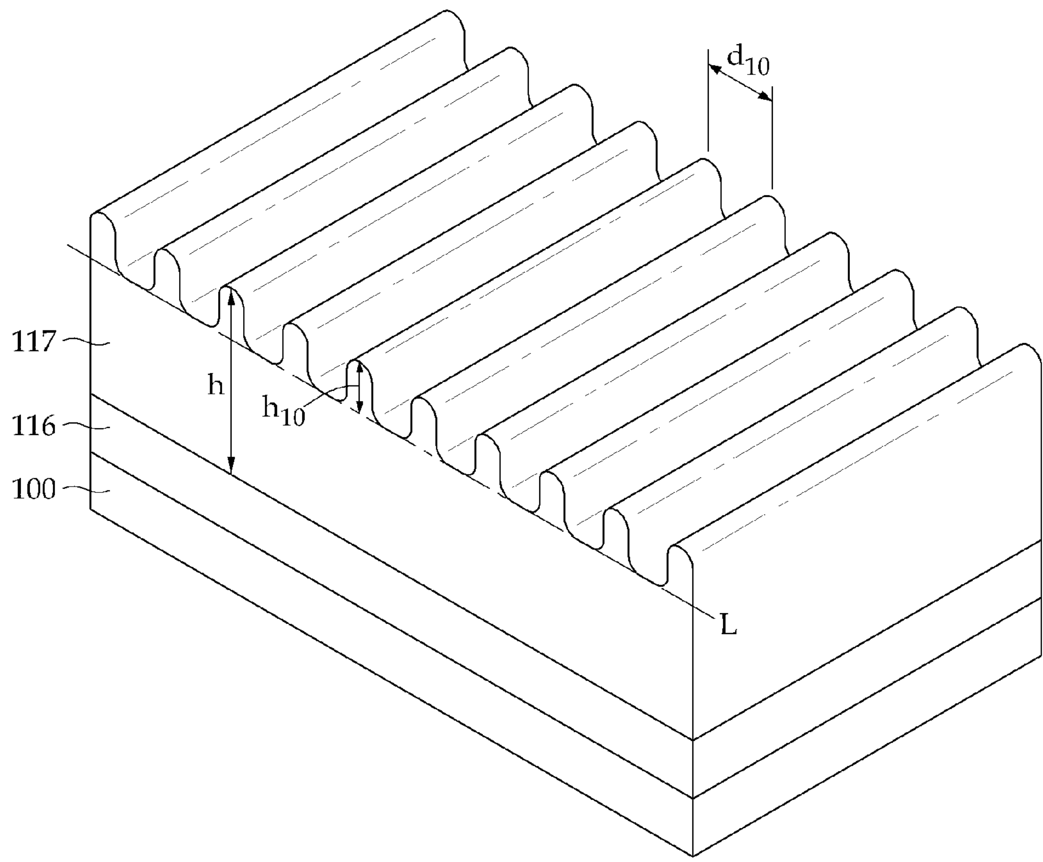
FIG. 2 is a diagram for describing a width and a distance of an uneven pattern formed on a top surface of a planarization layer in an organic light emitting diode display according to an exemplary embodiment of the invention.

Referring to FIG. 2, an insulating layer 116 and a planarization layer 117 are formed on a substrate 100, a thickness h of the planarization layer 117 indicates a height from a boundary between the insulating layer 116 and the planarization layer 117 to a top of the uneven pattern, and the thickness h of the planarization layer 117 may range from about 0.1 micrometer (μm) to about 10 micrometers (μm), for example, but is not limited thereto.

Further, a thickness $h_n$ and a width $d_n$ of the uneven pattern of the planarization layer 117 are formed in a non-uniform manner. The thickness $h_n$ of the uneven pattern indicates a height from an arbitrary line L to a top of the uneven pattern, a range of the thickness $h_n$ of the uneven pattern may be about 0.1 μm to about 10 μm, and the number of the uneven pattern may be about 1 per a pixel to about 30 per a pixel, for example, but is not limited thereto.

As illustrated in FIG. 2, a thickness $h_n$ of an uneven pattern disposed in the middle of a pixel is $h_{10}$ and a width $d_n$ of the uneven pattern disposed in the middle of the pixel is $d_{10}$. The n value may increase or decrease according to the number of the uneven pattern per pixel, and here n is 10 for the convenience of description. The thickness $h_n$ of the uneven pattern is gradually reduced from $h_{10}$ in the middle of the pixel toward opposing ends of the pixel away from the middle, and the width $d_n$ of the uneven pattern gradually increases from $d_{10}$ in the middle of the pixel toward the opposing ends of the pixel away from the middle.

A first electrode 200 includes an uneven pattern since an unevenness of the planarization layer 117 is reflected therein.

Figure 3:
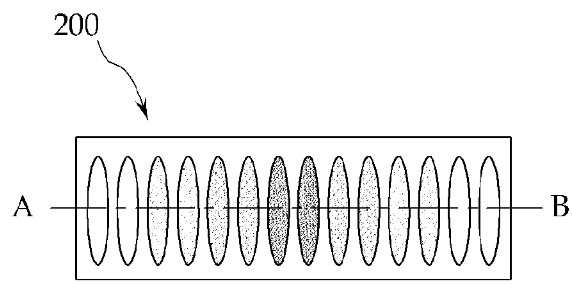
FIG. 3 is a plan view illustrating an uneven pattern formed in a pixel in an organic light emitting diode display according to an exemplary embodiment of the invention.

In detail, as illustrated in FIG. 3, a thickness of the uneven pattern becomes smaller as a distance from a center portion of the first electrode 200 becomes larger in a direction toward an outside A and B of the first electrode, and a width of the uneven pattern becomes larger as a distance from a center portion of the first electrode becomes larger in a direction toward the outside A and B of the first electrode, and thus the uneven pattern is formed in a non-uniform manner. Referring to FIG. 3, a gradation in a darker region indicates the uneven pattern having a larger thickness.

Figure 4A:
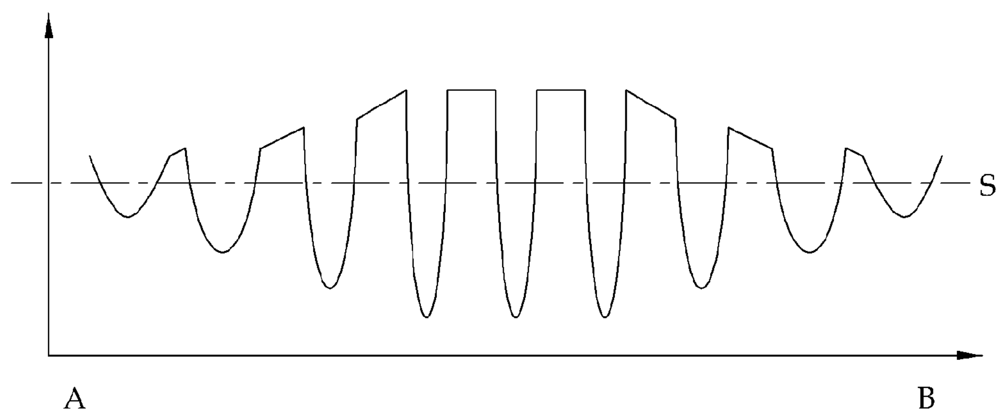
FIGS. 4A and 4B are diagrams illustrating a thickness profile of an uneven pattern formed in a pixel in an organic light emitting diode display according to an exemplary embodiment of the invention.
Figure 4B:
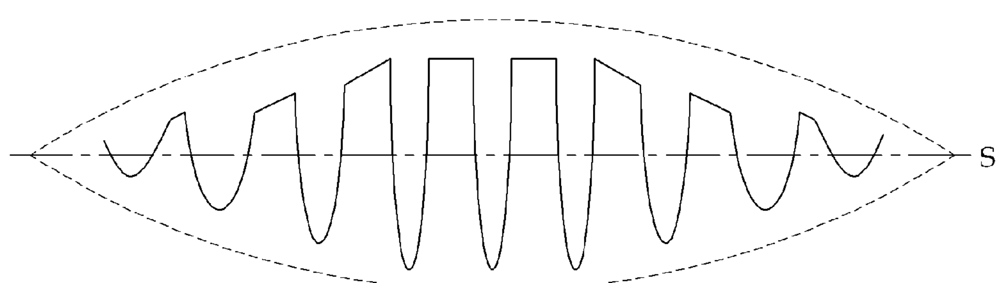

As illustrated in FIG. 4A, a thickness of the uneven pattern gradually increases from an outside of the first electrode toward a middle of the first electrode, and gradually decreases from a middle of the first electrode toward the outside A and B of the first electrode. Therefore, a thickness profile of the uneven pattern may be shown as a form of convex lens with reference to an imaginary line S as illustrated in FIGS. 4A and 4B.

Figure 5:
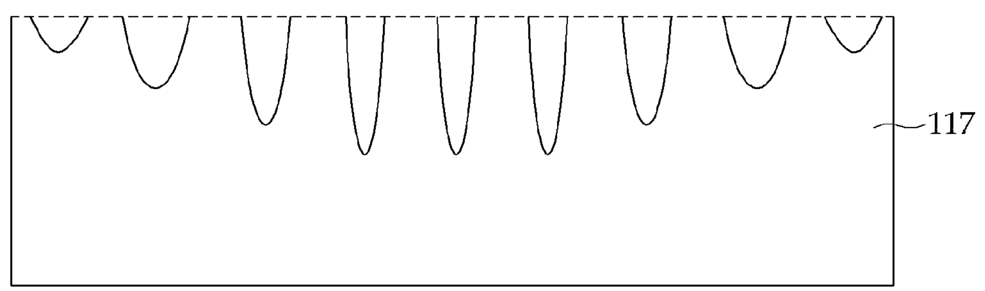
FIGS. 5 and 6 are cross-sectional views of a planarization layer 117 having an uneven pattern in an organic light emitting diode display according to another exemplary embodiment of the invention.
Figure 6:
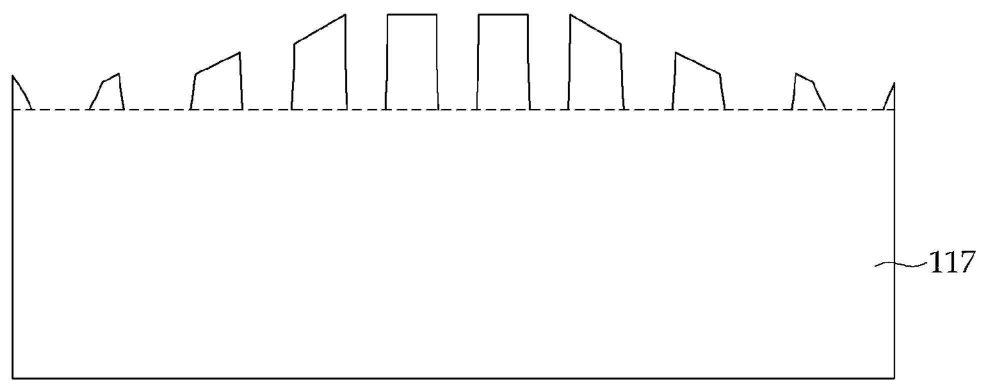

Meanwhile, the uneven pattern may have various forms. In other words, uneven patterns of the planarization layer 117 may have a form in which heights of the planarization layer 117 are the same, but degrees of etching of unevennesses are not uniform as shown in FIG. 5, or in which the degrees of etching of unevennesses are the same, but the heights of the planarization layer 117 are not uniform as shown in FIG. 6. As illustrated in FIG. 5, with reference to a plane of the maximum height protrusion of the even pattern, depths of the spaces between protrusions of the uneven pattern are different. In contrast, with reference to a plane of the maximum height protrusion of the uneven pattern in FIG. 6, depths of the spaces between protrusions of the uneven pattern are the same.

As described above, the uneven pattern may be formed in various manners of making its size, height, and width non-uniform. However, it is preferable to optimize combinations of uneven patterns in consideration of interference between lights emitted from an OLED.

The first electrode 200 may be a transparent or reflective electrode. When the first electrode 200 is a transparent electrode, it may include indium tin oxide (ITO), indium zinc oxide (IZO), zinc oxide (ZnO), or indium(III) oxide ($In_2O_3$), and when it is a reflective electrode, it may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof, and a layer including ITO, IZO, ZnO or $In_2O_3$ on the reflective layer. When the first electrode 200 is an anode, it may include ITO.

FIG. 1 illustrates that the first electrode 200 serves as an anode and the second electrode 400 serves as a cathode as an exemplary embodiment, but the first electrode 200 may be a cathode and the second electrode 400 may be an anode in another exemplary embodiment.

Between the first electrodes 200, a pixel defining layer ("PDL") 210 may be provided. The PDL 210 includes an insulating material and separates the first electrodes 200 into corresponding pixel units. In one exemplary embodiment, the PDL 210 may be disposed at edges of the first electrodes 200 to separate the first electrodes 200 into corresponding pixel units, thereby defining pixel regions, for example. That is, the PDL 210 may cover the edges of the first electrodes 200. Besides defining a pixel region, the PDL 210 widens a space between the edge of the first electrode 200 and the second electrode 400 so as to effectively prevent electric field from being concentrated at the edge of the first electrode 200, thereby effectively preventing a short circuit between the first electrode 200 and the second electrode 400.

An emission layer 300 is provided between the first electrode 200 and the second electrode 400. In detail, the emission layer 300 is disposed in an opening defined between adjacent first electrodes 200 separated by the PDL 210. The emission layer 300 includes a red emission layer 310, a green emission layer 320, and a blue emission layer 330.

Meanwhile, in addition to the emission layer 300, at least one or more of a hole injection layer, a hole transport layer, an electron transport layer, and an electron injection layer may be further disposed between the first electrode 200 and the second electrode 400. The emission layer 300, the hole injection layer, the hole transport layer, the electron transport layer, and the electron injection layer are collectively called the organic layer. The organic layer may include a low molecular weight organic material or a high molecular weight organic material.

The low molecular weight organic material may be applied to all of the hole injection layer, hole transport layer, emission layer, electron transport layer, and electron injection layer. The low molecular weight organic material may be laminated in a single or multi-layer structure, and applicable organic materials include copper phthalocyanine (CuPc), N,N'-Di (naphthalene-1-yl)-N,N'-diphenyl-benzidine (NPB), tris-8-hydroxyquinoline aluminum (Alq3), and the like. In one exemplary embodiment, the low molecular weight organic materials may be deposited by, for example, vacuum evaporation using a mask so as to form the emission layer 300, the hole injection layer, the hole transport layer, the electron transport layer, and the electron injection layer.

The high molecular weight organic material may be applied to a hole transport layer ("HTL") or an emission layer ("EML"). In one exemplary embodiment, the hole transport layer may include poly(3,4-ethylenedioxythiophene) (PEDOT), for example, and the emission layer may include a high molecular weight organic material such as poly-phenylenevinylene (PPV) or polyfluorene, for example. Poly(3,4-ethylenedioxythiophene)

A second electrode 400 is disposed on the emission layer 300 and the PDL 210. The second electrode 400 may include a material which is generally used in the art. The second electrode 400 may be a transparent or reflective electrode. When the second electrode 400 is a transparent electrode, it may include a layer including lithium (Li), calcium (Ca), lithium fluoride/calcium (LiF/Ca), lithium fluoride/aluminum LiF/Al, Al, Mg, or a combination thereof, and a layer formed thereon and including a transparent electrode-forming material such as ITO, IZO, ZnO or $In_2O_3$, for example. When the second electrode 400 is a reflective electrode, it may be formed by depositing Li, Ca, LiF/Ca, LiF/Al, Al, Mg, or a combination thereof. FIGS. 1 and 2 illustrate a top emission OLED display, and thus the second electrode 400 includes a transparent electrode. In one exemplary embodiment, the second electrode 400 may include LiF/Al, for example.

An exemplary embodiment of the invention also provides a manufacturing method of an OLED display.

According to an exemplary embodiment of the invention, the manufacturing method of an OLED display includes forming a planarization layer 117 on a substrate 100, forming an uneven pattern on a top surface of the planarization layer 117, forming a first electrode 200 on the planarization layer 117, forming an emission layer 300 on the first electrode 200, and forming a second electrode 400 on the emission layer 300.

Here, the manufacturing method may further include forming a plurality of thin film transistors 120 between the substrate 100 and the planarization layer 117.

In order to manufacture the OLED display, a plurality of switching thin film transistors and a plurality of driving thin film transistors are disposed on the substrate 100. Here, the forming of the switching thin film transistors and the driving thin film transistors includes laminating and patterning a conductive layer, an insulating layer and a semiconductor layer.

Next, the switching thin film transistors and the driving thin film transistors are coated with the planarization layer 117.

A mask is disposed on the planarization layer 117 to expose the planarization layer 117 to light, and an uneven pattern is formed on a top surface of the planarization layer 117.

The forming of the uneven pattern on a top surface of the planarization layer 117 includes arranging a mask having an opening defined therein on the planarization layer 117 to expose the planarization layer 117 to light, developing the planarization layer 117, etching the light exposed planarization layer 117 and curing the developed planarization layer 117.

In detail, an uneven pattern may be configured in various forms, sizes and widths, and may be carried out by using a mask having an opening completely transmitting light and a semi-transmitting portion transmitting only part of light. That is, there is a difference in light transmission of the mask between a center portion and an end portion.

Next, light such as ultraviolet light, for example, is irradiated on the mask for light exposure. Here, an amount of the exposure may be set under optimal conditions in consideration of an inclination angle of the unevenness as described above.

The mask is removed and the planarization layer 117 is etched and cured to form an uneven pattern.

A first electrode 200 is disposed on the planarization layer 117. In this case, the first electrode 200 includes an uneven pattern since an unevenness of the planarization layer 117 is reflected therein. A thickness of the uneven pattern becomes smaller as a distance from a center portion of the first electrode 200 becomes larger, and a width of the uneven pattern becomes larger as a distance from a center portion of the first electrode 200 becomes larger, and thus the uneven pattern is formed in a non-uniform manner.

Further, in one exemplary embodiment, the uneven pattern may have a thickness of about 0.1 μm to about 10 μm, for example, a width thereof may range from about 1 μm to about 20 μm, and the number of the uneven pattern in the first electrode 200 may be in the range of about 1 to about 30, for example, but the uneven pattern is not limited there to.

A PDL 210 may be provided between the first electrodes 200. The PDL 210 includes an insulating material and separates the first electrodes 200 into corresponding pixel units.

An emission layer 300 is disposed in an opening of the first electrode 200 separated into a pixel unit by the PDL 210. The emission layer 300 includes a red emission layer 310, a green emission layer 320, and a blue emission layer 330.

Meanwhile, at least one or more of a hole injection layer, a hole transport layer, an electron transport layer, and an electron injection layer may be further formed in addition to the emission layer 300.

After the emission layer 300 is formed, a second electrode 400 is disposed on the emission layer 300.

As described above, the OLED display and the manufacturing method thereof are only exemplified, and a person skilled in the art can understand that the scope of the invention may include various modifications and equivalent exemplary embodiments therefrom.

From the foregoing, it will be appreciated that various exemplary embodiments of the invention have been described herein for purposes of illustration, and that various modifications may be made without departing from the scope and spirit of the invention. Accordingly, the various exemplary embodiments disclosed herein are not intended to be limiting, with the true scope and spirit being indicated by the following claims.

What is claimed is:

1. An organic light emitting diode display, comprising:
- a substrate;
- a planarization layer on the substrate and comprising a unitary uneven pattern on a top surface thereof;
- a first electrode on the planarization layer;
- an emission layer on the first electrode; and
- a second electrode on the emission layer,
- wherein
- the unitary uneven pattern is defined by a plurality of strip lines respectively having different thicknesses and widths, and
- each respective strip has a thickness that becomes smaller as a distance between the respective strip line and a center portion of the first electrode becomes larger.

2. The organic light emitting diode display of claim 1, further comprising a thin film transistor layer between the substrate and the planarization layer.

3. The organic light emitting diode display of claim 1, wherein a width of strip lines of the plurality of strip lines becomes larger as the distance from the center portion of the first electrode becomes larger.

4. The organic light emitting diode display of claim 1, wherein the planarization layer has a thickness of about 0.1 μm to about 10 μm.

5. The organic light emitting diode display of claim 1, wherein the emission layer comprises a plurality of sub-emission layers which emits lights of different wavelengths from each other, and the lights of different wavelengths combine for white-light emission.

6. The organic light emitting diode display of claim 5, further comprising a color filter under the first electrode.

7. A manufacturing method of an organic light emitting diode display, comprising:
- disposing a planarization layer on a substrate;
- forming a unitary uneven pattern including a plurality of spaces defining a plurality of protruded strip lines on a top surface of the planarization layer;
- disposing a first electrode on the planarization layer;
- disposing an emission layer on the first electrode; and
- disposing a second electrode on the emission layer,
- wherein the forming of the unitary uneven pattern comprises etching the planarization layer, and a difference in a degree of etching exists between a center portion and an end portion of the first electrode where the difference in the degree of etching defines thicknesses of the protruded strip lines being smaller as a distance between the protruded strip lines and the center portion of the first electrode becomes larger.

8. The manufacturing method of the organic light emitting diode display of claim 7, further compring disposing a plurality of thin film transistors between the substrate and the planarization layer.

9. The manufacturing method of the organic light emitting diode display of claim 7, wherein the forming of the uneven pattern on the top surface of the planarization layer comprises arranging a mask including an opening defined therein on the planarization layer to expose the planarization layer to light, developing the planarization layer, etching the light exposed planarization layer and curing the developed planarization layer.

10. The manufacturing method of the organic light emitting diode display of claim 9, wherein the difference in the degree of etching is defined by a difference in light transmission of the mask between the center portion and the end portion.

* * * * *